(12) United States Patent
Xue et al.

(10) Patent No.: US 12,009,749 B2
(45) Date of Patent: Jun. 11, 2024

(54) SMART POWER STAGE CIRCUIT OF POWER CONVERTER AND CURRENT MONITORING CIRCUIT THEREOF

(71) Applicant: uPI semiconductor corp., Zhubei (TW)

(72) Inventors: Ya-Ran Xue, Zhubei (TW); Jung-Hung Tseng, Zhubei (TW); Heng-Li Lin, Zhubei (TW)

(73) Assignee: UPI SEMICONDUCTOR CORP., Zhubei (TW)

( * ) Notice: Subject to any disclaimer, the term of this patent is extended or adjusted under 35 U.S.C. 154(b) by 140 days.

(21) Appl. No.: 18/046,524

(22) Filed: Oct. 14, 2022

(65) Prior Publication Data

US 2023/0194577 A1    Jun. 22, 2023

(30) Foreign Application Priority Data

Dec. 17, 2021  (TW) .................................. 110147543

(51) Int. Cl.
*H02M 3/158* (2006.01)
*G01R 19/165* (2006.01)
*H02M 1/00* (2006.01)
*H02M 1/088* (2006.01)

(52) U.S. Cl.
CPC ...... *H02M 3/158* (2013.01); *G01R 19/16571* (2013.01); *H02M 1/0009* (2021.05); *H02M 1/088* (2013.01)

(58) Field of Classification Search
CPC ................ H02M 1/0009; H02M 3/156; G01R 19/16571; G01R 19/165
See application file for complete search history.

(56) References Cited

U.S. PATENT DOCUMENTS

| | | | | |
|---|---|---|---|---|
| 5,764,039 A * | 6/1998 | Choi | ................... | H02M 1/4225 323/222 |
| 7,482,791 B2 * | 1/2009 | Stoichita | ............... | H02M 3/156 323/288 |
| 8,446,135 B2 * | 5/2013 | Chen | ..................... | H02M 3/156 323/288 |
| 8,766,615 B2 * | 7/2014 | Nishida | ................ | H02M 3/156 323/283 |
| 9,184,651 B2 | 11/2015 | Nguyen et al. | | |

(Continued)

*Primary Examiner* — Yusef A Ahmed
(74) *Attorney, Agent, or Firm* — McClure, Qualey & Rodack, LLP

(57) ABSTRACT

A smart power stage (SPS) circuit of a power converter and a current monitoring circuit thereof are disclosed. The SPS circuit includes an output stage circuit and a driver. The output stage circuit receives an input voltage and the power converter provides an output voltage and an inductor current. The driver includes a driving circuit, a monitoring signal generation circuit and a compensation circuit. The driving circuit receives a PWM signal and provides a driving signal to the output stage circuit. The monitoring signal generation circuit receives the PWM signal, input voltage and output voltage for generating a monitoring signal related to the inductor current. The monitoring signal includes a simulated current signal. The compensation circuit is coupled to the monitoring signal generation circuit. When the simulated current signal is greater than a default value, the compensation circuit generates a compensation signal superposing to the simulated current signal.

10 Claims, 4 Drawing Sheets

(56) References Cited

U.S. PATENT DOCUMENTS

| | | | |
|---|---|---|---|
| 10,116,212 B2 | 10/2018 | Luo et al. | |
| 11,283,355 B2* | 3/2022 | Ke | H02M 3/158 |
| 2006/0125454 A1* | 6/2006 | Chen | H02M 3/1588 |
| | | | 323/282 |
| 2008/0278123 A1* | 11/2008 | Mehas | H02M 3/1588 |
| | | | 323/266 |
| 2009/0066301 A1* | 3/2009 | Oswald | H02M 3/1582 |
| | | | 323/351 |
| 2009/0153114 A1* | 6/2009 | Huang | H02M 3/1584 |
| | | | 323/282 |
| 2010/0148741 A1* | 6/2010 | Chen | H02M 3/158 |
| | | | 323/285 |
| 2011/0074373 A1* | 3/2011 | Lin | H02M 3/1582 |
| | | | 323/282 |
| 2011/0241641 A1* | 10/2011 | Chen | H02M 3/1588 |
| | | | 323/284 |
| 2013/0249509 A1* | 9/2013 | Nakamoto | H02M 3/158 |
| | | | 323/271 |
| 2013/0293211 A1* | 11/2013 | Chen | H02M 3/1588 |
| | | | 323/282 |
| 2015/0200536 A1* | 7/2015 | Li | H02H 7/1213 |
| | | | 361/18 |
| 2015/0200592 A1* | 7/2015 | Chang | H02M 3/156 |
| | | | 323/288 |
| 2020/0021189 A1* | 1/2020 | Li | H02M 3/158 |
| 2021/0006159 A1* | 1/2021 | Ke | H02M 3/158 |
| 2021/0203238 A1* | 7/2021 | Wu | H02M 3/1584 |
| 2021/0328509 A1* | 10/2021 | Tseng | H02M 1/0009 |
| 2021/0376725 A1* | 12/2021 | Sherigar | H02M 3/158 |
| 2021/0399635 A1* | 12/2021 | Chang | H02M 1/14 |
| 2022/0149734 A1* | 5/2022 | Chang | H02M 1/0009 |
| 2023/0387797 A1* | 11/2023 | Chang | H02M 1/0025 |

* cited by examiner

SMART POWER STAGE CIRCUIT OF POWER CONVERTER AND CURRENT MONITORING CIRCUIT THEREOF

BACKGROUND OF THE INVENTION

1. Field of the Invention

The invention relates to a smart power stage (SPS) circuit of a power converter; in particular, to a SPS circuit and a current monitoring circuit.

2. Description of the Prior Art

With the increasing integration of existing integrated circuits, the demand for smart output stage circuit products integrating the driving circuit and the power switch in the power converter becomes higher in the market. One of its main functions is to generate a monitoring signal related to the inductor current flowing through the output inductor, so that the controller of the power converter can adjust the PWM signal or activate other protection mechanisms according to the monitoring signal.

Due to the short turn-on time of the power switch in high frequency applications, the monitoring signal cannot be generated simply by direct sensing. Therefore, a simulated method can be used to generate a complete or partial monitoring signal for the operation of the controller. The problem encountered in practice is that when the inductor current is too large to saturate the output inductor and an abnormal waveform of the inductor current occurs, the monitoring signal cannot truly present the abnormal waveform of the inductor current in the saturated state of the output inductor, resulting in the controller being unable to perform corresponding operations immediately (for example, reducing the duty cycle of the PWM signal, over-current protection, etc.).

For example, as shown in FIG. 1, when the inductor current IL rises to the saturated inductor current value ITH, the waveform of the inductor current IL will begin to show spikes (as shown in the dotted circle), but this abnormal waveform will not be reproduced in the waveform of the monitoring signal IMON, causing the controller to misjudge and fail to respond immediately.

SUMMARY OF THE INVENTION

Therefore, the invention provides a smart power stage (SPS) circuit of a power converter and a current monitoring circuit thereof to solve the above-mentioned problems of the prior arts.

An embodiment of the invention is a SPS circuit of a power converter. In an embodiment, the SPS circuit includes an output stage circuit and a driver. The output stage circuit receives an input voltage and the power converter provides an output voltage and an inductor current. The driver includes a driving circuit, a monitoring signal generation circuit and a compensation circuit. The driving circuit receives a PWM signal and provides a driving signal to the output stage circuit. The monitoring signal generation circuit receives the PWM signal, the input voltage and the output voltage for generating a monitoring signal related to the inductor current. The monitoring signal includes a simulated current signal. The compensation circuit is coupled to the monitoring signal generation circuit. When the simulated current signal is greater than a default value, the compensation circuit generates a compensation signal superposing to the simulated current signal.

In an embodiment, when the simulated current signal is smaller than the default value, the compensation circuit stops generating the compensation signal.

In an embodiment, the output stage circuit includes a first switch and a second switch coupled in series with each other, and the monitoring signal generation circuit further includes a current sensing circuit configured to sense a current flowing through the second switch to generate a sensing current signal, and the monitoring signal generation circuit selectively outputs the simulated current signal or the sensing current signal as the monitoring signal according to the PWM signal.

In an embodiment, the monitoring signal generation circuit switches from outputting the simulated current signal to outputting the sensing current signal at a default time after the PWM signal changes from a first state to a second state.

In an embodiment, the compensation circuit includes an error amplifying circuit, a transistor and a compensation signal generation circuit. The error amplifying circuit has a first input terminal, a second input terminal and an output terminal. The first input terminal receives the monitoring signal and the second input terminal receives the default value. The error amplifying circuit generates an error amplification signal according to the monitoring signal and the default value. The transistor has a first terminal, a second terminal and a control terminal, the control terminal is coupled to the output terminal of the error amplifying circuit, and the second terminal is coupled to the second input terminal of the error amplifying circuit. The compensation signal generation circuit is coupled to the first terminal of the transistor and configured to selectively generate the compensation signal according to the error amplification signal.

In an embodiment, the compensation circuit further includes a resistor coupled to the second input terminal of the error amplifying circuit, wherein the resistor is configured to adjust a magnitude of the compensation signal.

In an embodiment, the output stage is also coupled to an output inductor, the default value is an adjustable reference voltage related to a saturation value of the output inductor.

In an embodiment, the monitoring signal generation circuit includes a first current generation circuit, a superposing circuit, a second current generation circuit and a switch. The first current generation circuit is configured to receive the input voltage and the output voltage and generate the simulated current signal according to the input voltage and the output voltage. The superposing circuit is coupled to the first current generation circuit and the compensation circuit respectively and configured to superpose the compensation signal on the simulated current signal. The second current generation circuit is configured to sense the inductor current to generate a sensing current signal. The switch is coupled to the first current generation circuit and the second current generation circuit, which controlled by the PWM signal to selectively output the simulated current signal or the sensing current signal as the monitoring signal.

Another preferred embodiment of the invention is current monitoring circuit. In this embodiment, the current monitoring circuit is applied to a SPS circuit of a power converter. The current monitoring circuit includes a monitoring signal generation circuit and a compensation circuit. The monitoring signal generation circuit is configured to generate a monitoring signal related to an inductor current of the power converter, wherein the monitoring signal includes a simulated current signal. The compensation circuit is coupled to the monitoring signal generation circuit, wherein when the simulated current signal is greater than a default value, the compensation circuit generates a compensation signal superposing to the simulated current signal.

In an embodiment, when the simulated current signal is smaller than the default value, the compensation circuit stops generating the compensation signal.

In an embodiment, the SPS circuit includes an output stage circuit. The output stage circuit includes a first switch and a second switch coupled in series with each other. The monitoring signal generation circuit further includes a current sensing circuit for sensing a current flowing through the first switch to generate a sensing current signal, and the monitoring signal generation circuit selectively outputs the simulated current signal or the sensing current signal as the monitoring signal according to a PWM signal.

In an embodiment, the monitoring signal generation circuit switches from outputting the simulated current signal to outputting the sensing current signal at a default time after the PWM signal changes from a first state to a second state.

In an embodiment, the compensation circuit includes an error amplifying circuit, a transistor and a compensation circuit. The error amplifying circuit has a first input terminal, a second input terminal and an output terminal. The first input terminal receives the monitoring signal and the second input terminal receives the default value. The error amplifying circuit generates an error amplification signal according to the monitoring signal and the default value. The transistor has a first terminal, a second terminal and a control terminal. The control terminal is coupled to the output terminal of the error amplifying circuit, and the second terminal is coupled to the second input terminal of the error amplifying circuit. The compensation circuit is coupled to the monitoring signal generation circuit, wherein when the simulated current signal is greater than a default value, the compensation circuit generates a compensation signal superposing to the simulated current signal.

In an embodiment, when the simulated current signal is smaller than the default value, the compensation circuit stops generating the compensation signal.

In an embodiment, the SPS circuit includes an output stage circuit. The output stage circuit includes a first switch and a second switch coupled in series with each other. The monitoring signal generation circuit further includes a current sensing circuit for sensing a current flowing through the first switch to generate a sensing current signal, and the monitoring signal generation circuit selectively outputs the simulated current signal or the sensing current signal as the monitoring signal according to a PWM signal.

In an embodiment, the monitoring signal generation circuit switches from outputting the simulated current signal to outputting the sensing current signal at a default time after the PWM signal changes from a first state to a second state.

In an embodiment, the compensation circuit includes an error amplifying circuit, a transistor and a compensation signal generation circuit. The error amplifying circuit has a first input terminal, a second input terminal and an output terminal. The first input terminal receives the monitoring signal and the second input terminal receives the default value. The error amplifying circuit generates an error amplification signal according to the monitoring signal and the default value. The transistor has a first terminal, a second terminal and a control terminal. The control terminal is coupled to the output terminal of the error amplifying circuit, and the second terminal is coupled to the second input terminal of the error amplifying circuit. The compensation signal generation circuit is coupled to the first terminal of the transistor and configured to selectively generate the compensation signal according to the error amplification signal.

In an embodiment, the compensation circuit further includes a resistor. The resistor is coupled to the second input terminal of the error amplifying circuit, wherein the resistor is configured to adjust a magnitude of the compensation signal.

In an embodiment, the SPS circuit is also coupled to an output inductor. The default value is an adjustable reference voltage related to a saturation value of the output inductor.

In an embodiment, the monitoring signal generation circuit includes a first current generation circuit, a superposing circuit, a second current generation circuit and a switch. The first current generation circuit is configured to receive an input voltage and an output voltage of the power converter and generate the simulated current signal according to the input voltage and the output voltage. The superposing circuit is coupled to the first current generation circuit and the compensation circuit respectively and configured to superpose the compensation signal on the simulated current signal. The second current generation circuit is configured to sense the inductor current to generate a sensing current signal. The switch is coupled to the first current generation circuit and the second current generation circuit, which controlled by a PWM signal to selectively output the simulated current signal or the sensing current signal as the monitoring signal.

Compared to the prior art, the SPS circuit of the power converter and its current monitoring circuit of the invention can properly compensate the waveform of the simulated current signal in the monitoring signal through the compensation circuit when the output inductance is in a saturated state, so that the compensated monitoring signal can more realistically reproduce the inductor current waveform in the saturated state of the output inductor, and the controller can immediately determine whether necessary protection actions are required through the compensated monitoring signal to effectively enhance the stability and safety of the system.

The advantage and spirit of the invention may be understood by the following detailed descriptions together with the appended drawings.

BRIEF DESCRIPTION OF THE APPENDED DRAWINGS

DETAILED DESCRIPTION OF THE INVENTION

Figure 1:
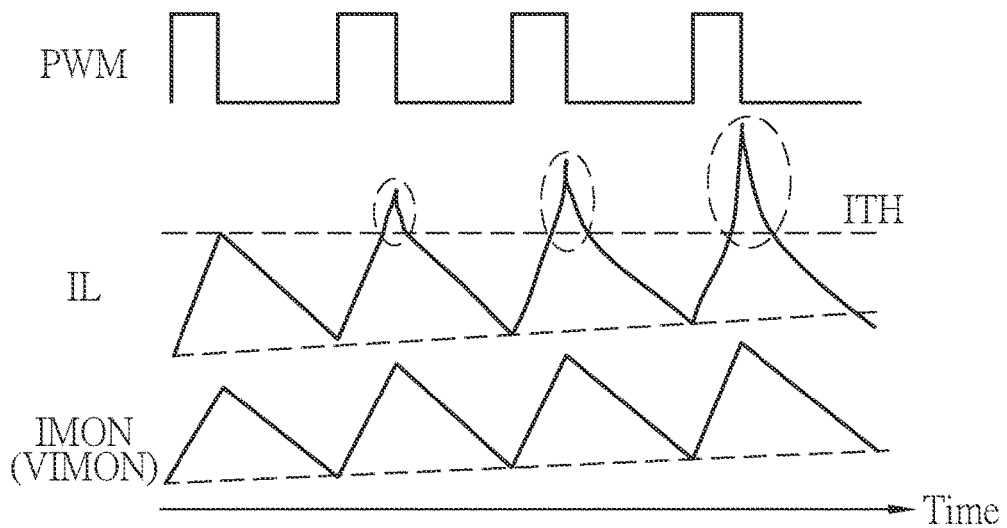
FIG. 1 illustrates a timing diagram showing that the monitoring signal of the prior art cannot reproduce the abnormal waveform of the inductor current when the output inductor is saturated.

Exemplary embodiments of the invention are referenced in detail now, and examples of the exemplary embodiments are illustrated in the drawings. Further, the same or similar reference numerals of the components in the drawings and the detailed description of the invention are used on behalf of the same or similar parts.

A preferred embodiment of the invention is a SPS circuit of a power converter. In this embodiment, the SPS circuit can be applied to different types of power conversion circuits, for example, buck conversion circuit or boost conversion circuit, and controlled by the pulse width modulation (PWM) signal provided by the controller and provides a monitoring signal related to an inductor current to the controller, for example, the monitoring signal of the current type (IMON) or the monitoring signal of the voltage type (VIMON), so that the controller can control the SPS circuit to adjust the inductor current or send protection messages in real time according to the monitoring signal to effectively enhance the stability and the safety of the system, but not limited to this.

Figure 2:
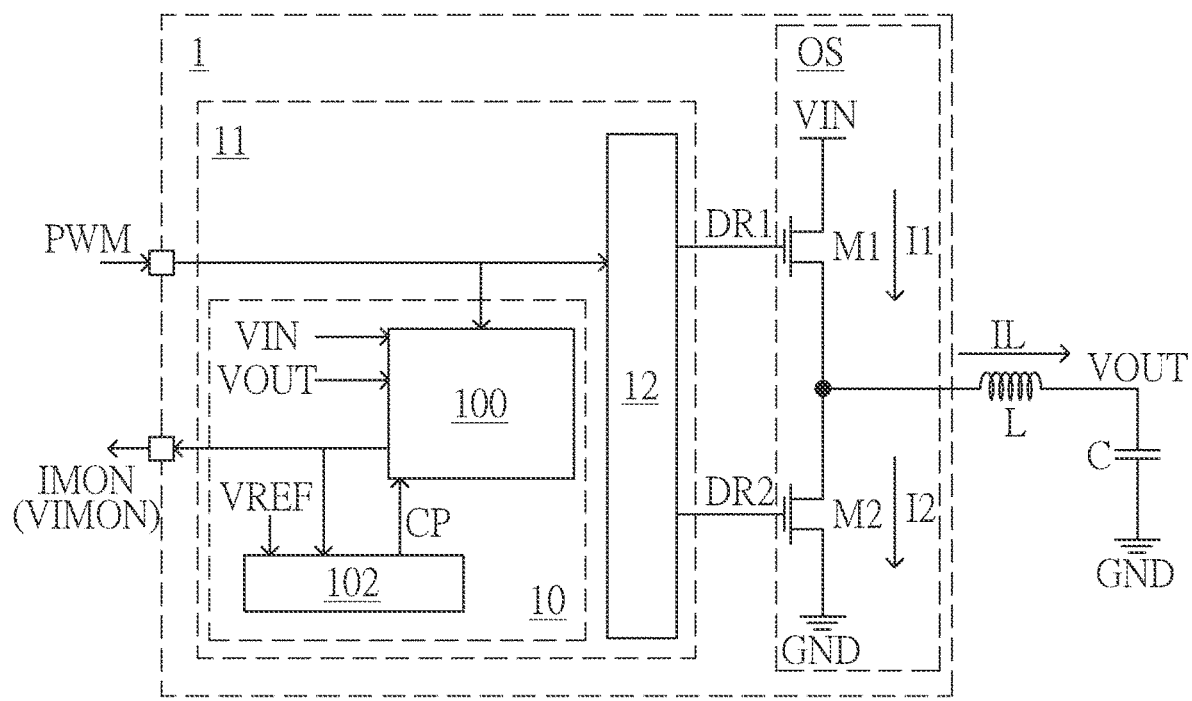
FIG. 2 illustrates a schematic diagram of the SPS circuit in an embodiment of the invention.

Please refer to FIG. 2. FIG. 2 illustrates a schematic diagram of a SPS circuit of the power converter in this embodiment. As shown in FIG. 2, the SPS circuit 1 is coupled to an output inductor L and an output capacitor C is coupled between the output inductor L and a ground terminal GND. The SPS circuit 1 includes a driver 11 and an output stage circuit OS. The driver 11 includes a current monitoring circuit 10 and a driving circuit 12. The current monitoring circuit 10 is coupled to the driving circuit 12. The driving circuit 12 is coupled to the output stage circuit OS. The output stage circuit OS is coupled to the output inductor L.

The output stage circuit OS receives the input voltage VIN to make the power converter to generate the output voltage VOUT and provide an inductor current IL flowing through the output inductor L. The output stage circuit OS includes an upper-bridge switch (a first switch) M1 and a lower-bridge switch (a second switch) M2 coupled in series with each other between the input voltage VIN and the ground terminal GND. One terminal of the output inductor L is coupled between the upper-bridge switch M1 and the lower-bridge switch M2 and the other terminal thereof has the output voltage VOUT. The driving circuit 12 receives the pulse width modulation signal PWM to provide driving signals DR1 and DR2 to the output stage circuit OS respectively to control the operation of the upper-bridge switch M1 and the lower-bridge switch M2.

The current monitoring circuit 10 includes a monitoring signal generation circuit 100 and a compensation circuit 102. The compensation circuit 102 is coupled to the monitoring signal generation circuit 100. The monitoring signal generation circuit 100 receives the pulse width modulation signal PWM, the input voltage VIN and the output voltage VOUT respectively, and is used to generate the monitoring signal IMON related to the inductor current IL, and the monitoring signal IMON includes a simulated current signal. According to circuit design requirements, the monitoring signal IMON can be in the form of current (IMON) or the form of voltage (VIMON). The compensation circuit 102 receives the monitoring signal IMON generated by the monitoring signal generation circuit 100.

When the simulated current signal in the monitoring signal IMON rises and starts to be greater than a default value VREF, the compensation circuit 102 starts to generate a compensation signal CP to the monitoring signal generation circuit 100 to compensate the simulated current signal of the monitoring signal IMON. When the simulated current signal in the monitoring signal IMON decreases and starts to be smaller than the default value VREF, the compensation circuit 102 will stop generating the compensation signal CP to the monitoring signal generation circuit 100, that is to say, stop compensating the simulated current signal of the monitoring signal IMON.

Actually, the default value VREF is an adjustable reference voltage, which can be generated by adjusting different numbers of diode strings according to the saturation value of the output inductance L, but not limited to this.

Figure 3:
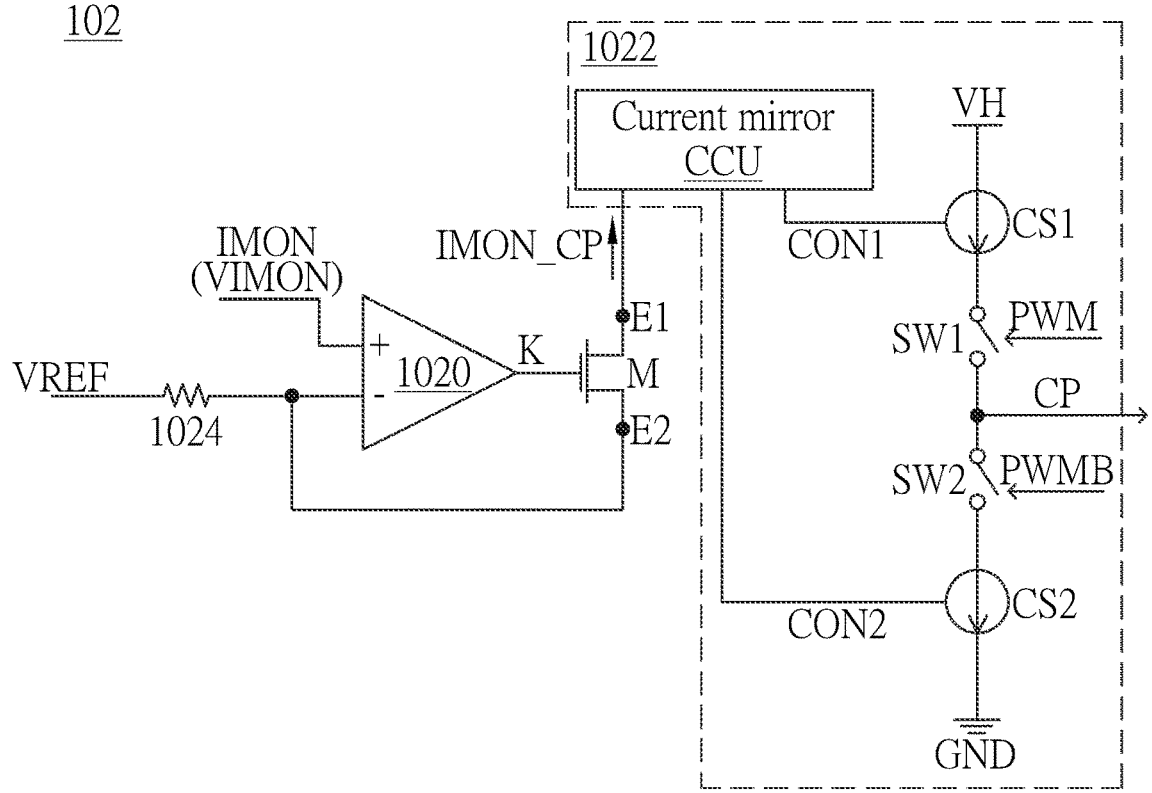
FIG. 3 illustrates a schematic diagram of an embodiment of the compensation circuit of the invention.

Please refer to FIG. 3. FIG. 3 illustrates a schematic diagram of an embodiment of the compensation circuit 102 of the invention. As shown in FIG. 3, the compensation circuit 102 includes an error amplifying circuit 1020, a transistor M, a compensation signal generation circuit 1022 and a resistor 1024. The error amplifying circuit 1020 has a positive input terminal + and a negative input terminal −. The resistor 1024 is coupled to the negative input terminal − of the error amplifying circuit 1020. The positive input terminal + receives the monitoring signal IMON from the monitoring signal generation circuit 100 and the negative input terminal − receives the default value VREF. The first terminal of the transistor M is coupled to the compensation signal generation circuit 1022, the second terminal of the transistor M is coupled to the second input terminal (the negative input terminal −) of the error amplifying circuit 1020, and the control terminal of the transistor M is coupled to the output terminal of the error amplifying circuit 1020.

In fact, the resistor 1024 can further be a variable resistor, so as to change the magnitude of the compensation current IMON_CP generated by the compensation circuit 102 according to design requirements, thereby changing the slope of the compensated monitoring signal IMON, but not limited to this.

In detail, the compensation signal generation circuit 1022 can include a current mirror CCU, current sources CS1~CS2 and switch switches SW1~SW2. A first terminal E1 and a second terminal E2 of the transistor M are coupled to the current mirror CCU in the compensation signal generation circuit 1022 and the negative input terminal − of the error amplifying circuit 1020 respectively, and the control terminal of the transistor M is coupled to the output terminal of the error amplifier circuit 1020 to receive the error amplification signal K and to generate the compensation current IMON_CP through the on-resistance of the transistor M and the resistor 1024, and to provide it to the current mirror CCU. The current source CS1, the switch SW1, the switch SW2 and the current source CS2 are coupled in series between the voltage VH (for example, the working voltage) and the ground terminal GND. The current mirror CCU is coupled to the current sources CS1~CS2 respectively, and the currents CON1~CON2 are replicated to the current sources CS1~CS2 for output according to the compensation current IMON_CP respectively. The switches SW1~SW2 are controlled by the pulse width modulation signal PWM and its inverse pulse width modulation signal PWMB respectively to output the compensation signal CP to the monitoring signal generation circuit 100.

Figure 4:
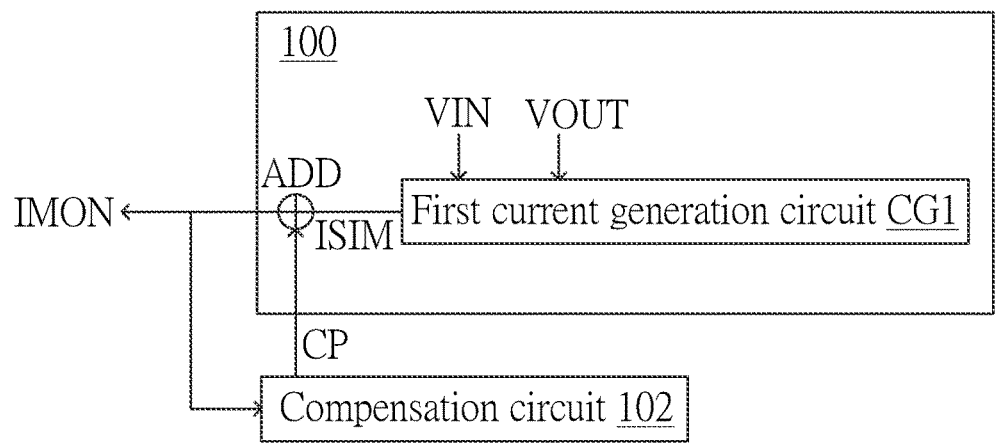
FIG. 4 illustrates a schematic diagram of an embodiment of the monitoring signal generation circuit of the invention.

In an embodiment, as shown in FIG. 4, the monitoring signal IMON is in the form of current, and the monitoring signal IMON is all composed of the simulated current signal ISIM. The monitoring signal generation circuit 100 includes a first current generation circuit CG1 and a superposing circuit ADD. The superposing circuit ADD is coupled to the first current generation circuit CG1 and the compensation circuit 102. The first current generation circuit CG1 receives the input voltage VIN and the output voltage VOUT respectively, and generates the simulated current signal ISIM to the superposing circuit ADD according to the input voltage VIN and the output voltage VOUT. When the simulated current signal in the monitoring signal IMON rises and starts to be greater than the default value VREF, the compensation circuit 102 starts to provide the compensation signal CP to the superposing circuit ADD, so that the superposing circuit ADD superposes the compensation signal CP on the simulated current signal ISIM and then outputs it as the monitoring signal IMON. In this embodiment, since the signals are all in the form of current, the superposing circuit ADD is only a circuit node.

Figure 5:
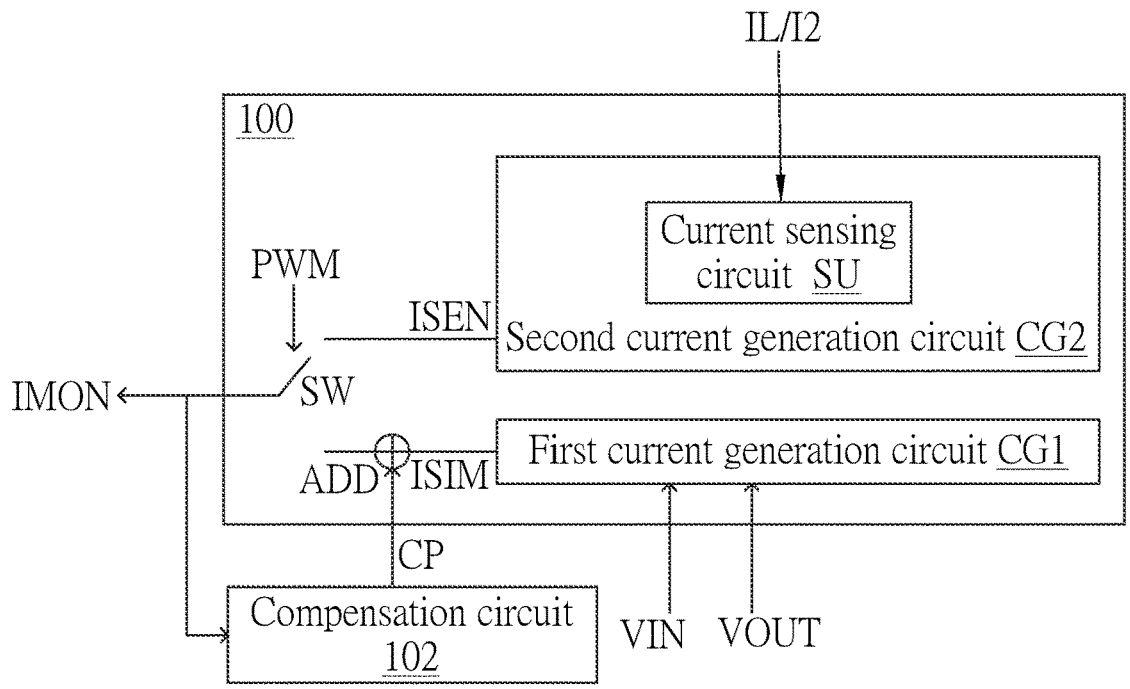
FIG. 5 illustrates a schematic diagram of another embodiment of the monitoring signal generation circuit of the invention.

In another embodiment, as shown in FIG. 5, the waveform of the monitoring signal IMON is composed of the waveform of the simulated current signal ISIM and the waveform of the sensing current signal ISEN, and the waveform of the simulated current signal ISIM is obtained by simulating the waveform of the inductor current IL (i.e., the upper-bridge switch current I1) when the upper-bridge switch M1 is turned on and the lower-bridge switch M2 is turned off, and the waveform of the sensing current signal ISEN is obtained by sensing the waveform of the inductor current IL (i.e., the lower-bridge switch current I2) when the upper-bridge switch M1 is turned off and the lower-bridge switch M2 is turned on.

In other words, since the waveform of the simulated current signal ISIM in this embodiment is obtained by simulating the waveform of the upper-bridge switch current I1, the compensation circuit 102 starts to provide the compensation signal CP to the monitoring signal generation circuit 100 only when the upper-bridge switch M1 is turned on, the lower-bridge switch M2 is turned off and the simulated current signal ISIM rises and greater than the default value VREF. Once the simulated current signal ISIM decreases and below the default value VREF, the compensation circuit 102 stops providing the compensation signal CP to the monitoring signal generation circuit 100.

Conversely, if the waveform of the simulated current signal ISIM is a waveform simulating the inductor current IL (that is, the lower-bridge switch current I2) when the upper-bridge switch M1 is turned off and the lower-bridge switch M2 is turned on, then the compensation circuit 102 starts to provide the compensation signal CP to the monitoring signal generation circuit 100 only when the upper-bridge switch M1 is turned off, the lower-bridge switch M2 is turned on, and the simulated current signal ISIM rises and greater than the default value VREF. Once the simulated current signal ISIM decreases and below the default value VREF, the compensation circuit 102 will stop providing the compensation signal CP to the monitoring signal generation circuit 100.

The monitoring signal generation circuit 100 includes a first current generation circuit CG1, a second current generation circuit CG2, a superposing circuit ADD and a switching circuit SW. The superposing circuit ADD is coupled to the first current generation circuit CG1 and the compensation circuit 102. The first current generation circuit CG1 receives the input voltage VIN and the output voltage VOUT respectively and generates a simulated current signal ISIM to the superposing circuit ADD according to the input voltage VIN and the output voltage VOUT. When the simulated current signal ISIM rises and greater than the default value VREF, the compensation circuit 102 starts to provide the compensation signal CP to the superposing circuit ADD for the superposing circuit ADD to superpose the compensation signal CP on the simulated current signal ISIM.

Since the waveform of the monitoring signal IMON in this embodiment is obtained by simulating the waveform of the upper-bridge switch current I1 and sensing the waveform of the lower-bridge switch current I2, the current sensing circuit SU in the second current generation circuit CG2 is coupled to the output stage circuit OS and used for sensing the lower-bridge switch current I2 flowing through the lower-bridge switch M2 when the lower-bridge switch M2 is turned on. The second current generation circuit CG2 generates the sensing current signal ISEN according to the lower-bridge switch current I2 (i.e., the inductor current IL during the conduction period of the lower-bridge switch M2). The switching circuit SW is controlled by the pulse width modulation signal PWM and selectively coupled to the first current generation circuit CG1 or the second current generation circuit CG2, so as to selectively output the waveform of the simulated current signal ISIM or the waveform of the sensing current signal ISEN at different times to form a complete waveform of the entire monitoring signal IMON.

It should be noted that, although the above-mentioned embodiment is described by taking the waveform of the monitoring signal IMON obtained by simulating the waveform of the upper-bridge switch current I1 and the waveform of the sensing lower-bridge switch current I2 as an example, in fact, the waveform of the monitoring signal IMON can also be obtained by simulating the waveform of the lower-bridge switch current I2 and sensing the waveform of the upper-bridge switch current I1, and there is no specific limitation. In addition, for the monitoring signal IMON of the current type, the superposing circuit ADD in FIG. 4 and FIG. 5 can be substantially a circuit node. If the monitoring signal of the voltage type is required to be output, it is only necessary to configure a current-to-voltage circuit (not shown) behind the superposing circuit ADD according to the design requirements, which will not be repeated here.

In practical applications, within a default time period after the pulse width modulation signal PWM changes from the first state to the second state (for example, 400 nanoseconds after the pulse width modulation signal PWM changes from high level to low level, but not limited to this), the simulated current signal ISIM can be corrected according to the sensing current signal ISEN to prevent the monitoring signal IMON from jumping when the monitoring signal IMON switches from the simulated current signal ISIM to the sensing current signal ISEN. The switching circuit SW switches from being coupled to the first current generation circuit CG1 to being coupled to the second current generation circuit CG2 after the default time, so that the monitoring signal generation circuit 100 switches from outputting the waveform of the simulated current signal ISIM to the waveform of the sensing current signal ISEN.

Figure 6:
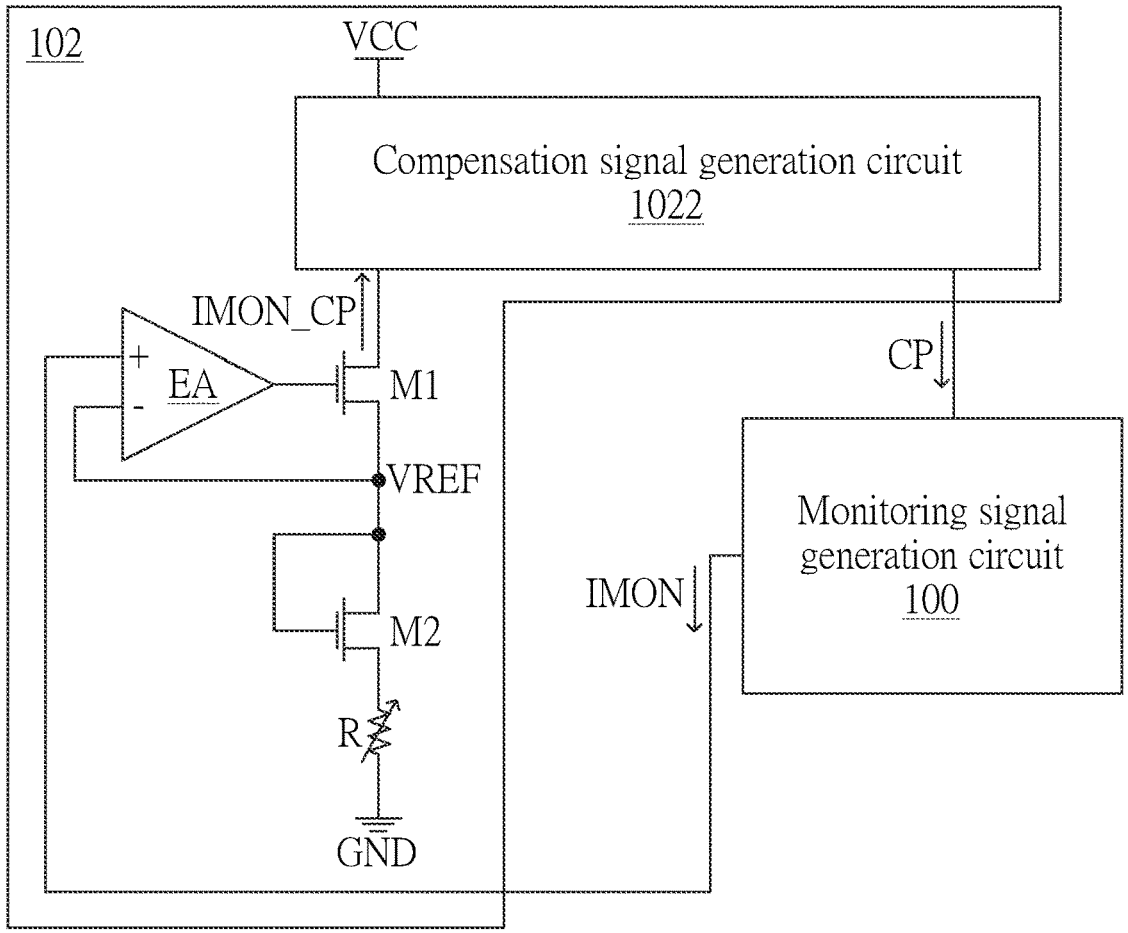
FIG. 6 illustrates a schematic diagram of the compensation circuit selectively providing a compensation signal back to the monitoring signal generation circuit according to the monitoring signal generated by the monitoring signal generation circuit in the invention.

Please refer to FIG. 6. FIG. 6 illustrates a schematic diagram of the compensation circuit 102 selectively providing the compensation signal CP back to the monitoring signal generation circuit 100 according to the monitoring signal IMON generated by the monitoring signal generation circuit 100.

As shown in FIG. 6, the compensation circuit 102 can include an error amplifying circuit EA, switches M1~M2, a variable resistor R, and a compensation signal generation circuit 1022. The switch M1, the switch M2 and the variable resistor R are serially coupled between the current mirror CM and the ground terminal GND in order. The control terminal of the switch M1 is coupled to the output terminal of the error amplifying circuit EA and the control terminal of the switch M2 is coupled between the switches M1 and M2. The positive input terminal + of the error amplifying circuit EA is coupled to the monitoring signal generation circuit 100 and the negative input terminal − is coupled between the switches M1 and M2. The compensation signal generation circuit 1022 is coupled to the power supply voltage VCC, the switch M1 and the monitoring signal generation circuit 100 respectively. The positions of the switch M2 and the variable resistor R for generating the default value VREF can be interchanged, which will not affect the overall circuit operation.

When the monitoring signal generation circuit 100 provides the monitoring signal IMON to the compensation circuit 102, the positive input terminal + of the error amplifying circuit EA receives the monitoring signal IMON and its negative input terminal − receives the default value VREF. The error amplification circuit EA selectively generates the error amplification signal K to the switch M1 according to the monitoring signal IMON and the default value VREF. The switch M1 provides the compensation current IMON_CP to the compensation signal generation circuit 1022 and the compensation signal generation circuit 1022 outputs the compensation signal CP to the monitoring signal generation circuit 100.

It should be noted that, since there are the switch M1 and the variable resistance R between the power supply voltage VCC and the ground terminal GND, the compensation current IMON_CP is related to the on-resistance of the switch M1 and the variable resistance R, that is, the magnitude of the compensation signal CP can be changed by changing the value of the variable resistor R. In an embodiment, the magnitude of the compensation signal CP provided by the compensation circuit 102 can be adjusted by changing the resistance value of the variable resistor R, but not limited to this.

The switch M2 is gate-source coupled to form a diode element and it can use its on-voltage to generate the default value VREF. In another embodiment, the switch M2 can be a diode string with an adjustable number of series-connected diodes, so that the default value VREF can be set according to the saturation value of the external inductance, so as to adjust the generation timing of the compensation signal CP, but not limited to this.

Figure 7:
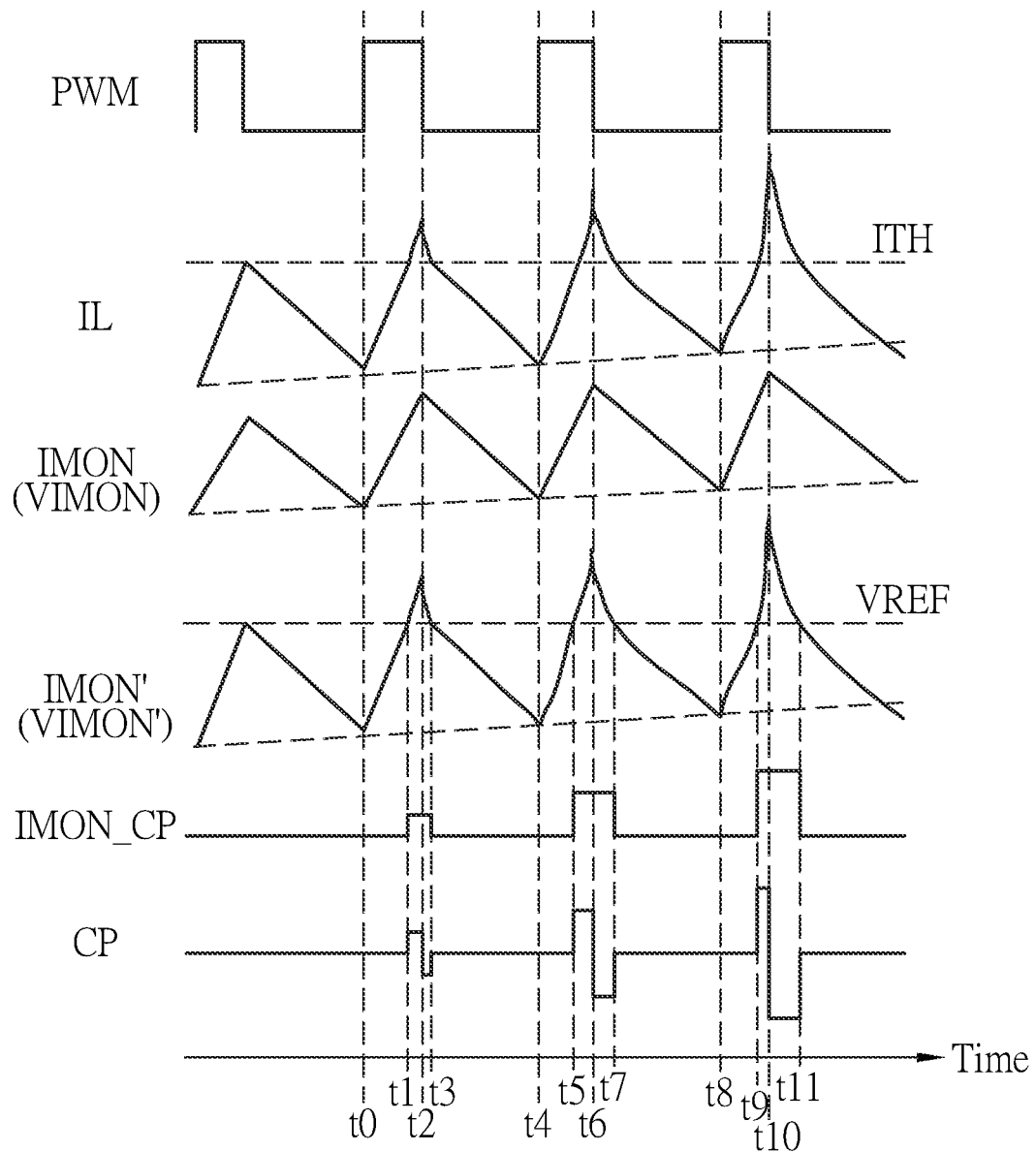
FIG. 7 illustrates a timing diagram showing that the waveform of the compensated monitoring signal of FIG. 4 reproduces the abnormal waveform occurred when the output inductor current reaches saturation.

Please refer to FIG. 7. FIG. 7 illustrates a timing diagram showing that the waveform of the compensated monitoring signal IMON' of FIG. 4 reproduces the abnormal waveform occurred when the output inductor current IL reaches saturation. The compensated monitoring signal IMON' in this embodiment is a current-type monitoring signal, but not limited to this. It should be noted that, the feedback path of the monitoring signal IMON can be configured with a voltage-current conversion circuit as required to meet application requirements, and details are not described here.

As shown in FIG. 7, at the time t1, the pulse width modulation signal PWM is at high level, and the waveform of the inductor current IL rises to the saturation current value ITH and reaches saturation; at the time t2, the pulse width modulation signal PWM changes from high level to low level, and the waveform of the inductor current IL begins to drop; at the time t3, the waveform of the inductor current IL drops to the saturation current value ITH and is released from saturation. Therefore, the waveform of the inductor current IL is in the saturated state during the period from the time t1 to the time t3.

During the period from the time t1 to the time t3, the waveform of the monitoring signal IMON of the prior art still rises and falls according to the original slope, which is different from the waveform of the actual inductor current IL, but the compensation circuit 102 of the invention will start to generate the compensation current IMON_CP to compensate the waveform of the monitoring signal IMON (that is, it starts to change the slope of the waveform of IMON) at the time t1 because the waveform of the monitoring signal IMON rises to reach the default value VREF. At the time t2, the compensation circuit 102 of the invention will start to extract the compensation current IMON_CP of the same size from the waveform of the monitoring signal IMON because the pulse width modulation signal PWM changes from high level to low level, that is, the value of the compensation signal CP changes from positive to negative until the time t3. At the time t3, because of the waveform the monitoring signal IMON drops and reaches the default value VREF, the generation of the compensation current IMON_CP is stopped, that is, the generation of the compensation signal CP is stopped.

The difference between the time t5 to the time t7 and the time t9 to the time t11 is only that the feedback monitoring signal IMON has a larger error with the default value VREF, so that the value of the compensation current IMON_CP is larger, and other actions are the same and not repeated here.

By the above method, the compensated monitoring signal IMON' of the invention can faithfully present the waveform in the saturated state of the output inductance, so that the controller can immediately send a protection message according to the compensated monitoring signal IMON', so it can effectively enhance system stability and security.

It should be noted that the real inductor current IL is not a smooth straight line, but a slightly fluttering curve; however, under the premise of not affecting the operation of the loop, the monitoring signal IMON and the compensated monitoring signal IMON' in FIG. 6 will appear as a straight wave type.

Another specific embodiment of the invention is a current monitoring circuit. Please also refer to FIG. 2, in this embodiment, the current monitoring circuit 10 is coupled to the driving circuit 12. The output stage circuit OS includes an upper-bridge switch M1 and a lower-bridge switch M2 coupled in series between the input voltage VIN and the ground terminal GND. The driving circuit 12 is coupled to the control terminals of the upper-bridge switch M1 and the lower-bridge switch M2 of the output stage circuit OS respectively. The output stage circuit OS is coupled to the output inductor L and provides an inductor current IL flowing through the output inductor L. The current monitoring circuit 10 includes a monitoring signal generation circuit 100 and a compensation circuit 102. The monitoring signal generation circuit 100 generates a monitoring signal IMON related to the inductor current IL. The monitoring signal IMON includes the simulated current signal ISIM.

The compensation circuit 102 is coupled to the monitoring signal generation circuit 100, and selectively generates a compensation signal CP according to the monitoring signal IMON and the error amplification signal of the default value VREF to compensate the simulated current signal ISIM of the monitoring signal IMON. When the simulated current signal ISIM is greater than the default value VREF, the compensation circuit 102 generates a compensation signal CP to compensate the simulated current signal ISIM. When the simulated current signal ISIM is smaller than the default value VREF, the compensation circuit 102 stops generating the compensation signal CP. As for the detailed description of the current monitoring circuit 10 in this embodiment, reference can be made to the relevant descriptions in the preceding paragraphs, which will not be repeated here.

Compared to the prior art, the SPS circuit of the power converter and its current monitoring circuit of the invention can properly compensate the waveform of the simulated current signal in the monitoring signal through the compensation circuit when the output inductance is in a saturated state, so that the compensated monitoring signal can more realistically reproduce the inductor current waveform in the saturated state of the output inductor, and the controller can immediately determine whether necessary protection actions are required through the compensated monitoring signal to effectively enhance the stability and safety of the system.

With the example and explanations above, the characteristics and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A smart power stage (SPS) circuit of a power converter, comprising:
    an output stage circuit, configured to receive an input voltage so that the power converter provides an output voltage and an inductor current; and
    a driver, coupled to the output stage circuit, the driver comprising:
        a driving circuit, coupled to the output stage circuit and configured to receive a pulse-width modulation (PWM) signal and provide a driving signal to the output stage circuit;
        a monitoring signal generation circuit, configured to receive the PWM signal, the input voltage and the output voltage to generate a monitoring signal related to the inductor current, the monitoring signal comprising a simulated current signal; and
        a compensation circuit, coupled to the monitoring signal generation circuit,
    wherein when the simulated current signal is greater than a default value, the compensation circuit generates a compensation signal superposing to the simulated current signal;
    wherein the monitoring signal circuit comprises:
        first current generation circuit, configured to receive the input voltage and the output voltage and generate the simulated current signal according to the input voltage and the output voltage;
        a superposing circuit, coupled to the first current generation circuit and the compensation circuit respectively, configured to superpose the compensation signal on the simulated current signal;
        a second current generation circuit configured to sense the inductor current to generate a sensing current signal; and
        a switch, coupled to the first current generation circuit and the second current generation circuit, which is controlled by the PWM signal to selectively output the simulated current signal or the sensing current signal as the monitoring signal, and
    wherein the compensation circuit comprises:
        an error amplifying circuit having a first input terminal, a second input terminal and an output terminal, the first input terminal receiving the monitoring signal and the second input terminal receiving the default value, the error amplifying circuit generating an error amplification signal according to the monitoring signal and the default value;
        a transistor having a first terminal, a second terminal and a control terminal, the control terminal being coupled to the output terminal of the error amplifying circuit, and the second terminal being coupled to the second input terminal of the error amplifying circuit;
        a compensation signal generation circuit coupled to the first terminal of the transistor and configured to selectively generate the compensation signal according to the error amplification signal, and
        a resistor coupled to the second input terminal of the error amplifying circuit, wherein the resistor is configured to adjust a magnitude of the compensation signal.

2. The SPS circuit of claim 1, wherein when the simulated current signal is smaller than the default value, the compensation circuit stops generating the compensation signal.

3. The SPS circuit of claim 1, wherein the output stage circuit comprises a first switch and a second switch coupled in series with each other, and the monitoring signal generation circuit further comprises a current sensing circuit configured to sense a current flowing through the second switch to generate the sensing current signal, and the monitoring signal generation circuit selectively outputs the simulated current signal or the sensing current signal as the monitoring signal according to the PWM signal.

4. The SPS circuit of claim 3, wherein the monitoring signal generation circuit switches from outputting the simulated current signal to outputting the sensing current signal at a default time after the PWM signal changes from a first state to a second state.

5. The SPS circuit of claim 1, wherein the output stage is also coupled to an output inductor, the default value is an adjustable reference voltage related to a saturation value of the output inductor.

6. A current monitoring circuit, applied to a smart power stage (SPS) circuit of a power converter, the current monitoring circuit comprising:
    a monitoring signal generation circuit configured to generate a monitoring signal related to an inductor current of the power converter, wherein the monitoring signal comprises a simulated current signal; and
    a compensation circuit, coupled to the monitoring signal generation circuit, wherein when the simulated current signal is greater than a default value, the compensation circuit generates a compensation signal superposing to the simulated current signal,
    wherein the monitoring signal generation circuit comprises:
    a first current generation circuit, configured to receive an input voltage and an output voltage of the power converter and generate the simulated current signal according to the input voltage and the output voltage;
    a superposing circuit, coupled to the first current generation circuit and the compensation circuit respectively, configured to superpose the compensation signal on the simulated current signal;
    a second current generation circuit, configured to sense the inductor current to generate a sensing current signal; and
    a switch, coupled to the first current generation circuit and the second current generation circuit, which is controlled by a PWM signal to selectively output the simulated current signal or the sensing current signal as the monitoring signal, and wherein the compensation circuit comprises:

an error amplifying circuit having a first input terminal, a second input terminal and an output terminal, the first input terminal receiving the monitoring signal and the second input terminal receiving the default value, the error amplifying circuit generating an error amplification signal according to the monitoring signal and the default value;

a transistor having a first terminal, a second terminal and a control terminal, the control terminal being coupled to the output terminal of the error amplifying circuit, and the second terminal being coupled to the second input terminal of the error amplifying circuit;

a compensation signal generation circuit coupled to the first terminal of the transistor and configured to selectively generate the compensation signal according to the error amplification signal; and a resistor coupled to the second input terminal of the error amplifying circuit, wherein the resistor is configured to adjust a magnitude of the compensation signal.

7. The current monitoring circuit of claim 6, wherein when the simulated current signal is smaller than the default value, the compensation circuit stops generating the compensation signal.

8. The current monitoring circuit of claim 6, wherein the SPS circuit comprises an output stage circuit, the output stage circuit comprises a first switch and a second switch coupled in series with each other, the monitoring signal generation circuit further comprises a current sensing circuit for sensing a current flowing through the first switch to generate the sensing current signal, and the monitoring signal generation circuit selectively outputs the simulated current signal or the sensing current signal as the monitoring signal according to a PWM signal.

9. The current monitoring circuit of claim 8, wherein the monitoring signal generation circuit switches from outputting the simulated current signal to outputting the sensing current signal at a default time after the PWM signal changes from a first state to a second state.

10. The current monitoring circuit of claim 6, wherein the SPS circuit is also coupled to an output inductor, the default value is an adjustable reference voltage related to a saturation value of the output inductor.

* * * * *